(12) United States Patent
Sone et al.

(10) Patent No.: US 6,999,288 B2
(45) Date of Patent: Feb. 14, 2006

(54) MAGNETORESISTIVE EFFECT ELEMENT AND MAGNETIC MEMORY DEVICE

(75) Inventors: Takeyuki Sone, Miyagi (JP); Kazuhiro Bessho, Kanagawa (JP); Masanori Hosomi, Miyagi (JP); Tetsuya Mizuguchi, Kanagawa (JP); Kazuhiro Ohba, Miyagi (JP); Tetsuya Yamamoto, Kanagawa (JP); Yutaka Higo, Miyagi (JP); Hiroshi Kano, Kanagawa (JP)

(73) Assignee: Sony Corporation, Tokyo (JP)

( * ) Notice: Subject to any disclaimer, the term of this patent is extended or adjusted under 35 U.S.C. 154(b) by 8 days.

(21) Appl. No.: 11/088,565

(22) Filed: Mar. 24, 2005

(65) Prior Publication Data

US 2005/0162905 A1 Jul. 28, 2005

Related U.S. Application Data

(63) Continuation of application No. 10/486,737, filed as application No. PCT/JP03/07495 on Jun. 12, 2003, now Pat. No. 6,879,473.

(30) Foreign Application Priority Data

Jun. 19, 2002 (JP) .......................... P2002-178963

(51) Int. Cl.
G11B 5/39 (2006.01)
(52) U.S. Cl. ................................. 360/324.12
(58) Field of Classification Search ..................... None
See application file for complete search history.

(56) References Cited

U.S. PATENT DOCUMENTS

| | | | | |
|---|---|---|---|---|
| 6,226,160 | B1 * | 5/2001 | Gallagher et al. | 360/324.2 |
| 6,347,049 | B1 * | 2/2002 | Childress et al. | 365/173 |
| 6,584,029 | B1 * | 6/2003 | Tran et al. | 365/225.7 |
| 6,730,395 | B1 * | 5/2004 | Covington | 428/323 |
| 6,756,128 | B1 * | 6/2004 | Carey et al. | 428/457 |
| 6,781,801 | B1 * | 8/2004 | Heinonen et al. | 360/324.2 |
| 6,791,806 | B1 * | 9/2004 | Gao et al. | 360/324.2 |
| 6,812,039 | B1 * | 11/2004 | Kohlstedt et al. | 438/3 |
| 6,876,523 | B1 * | 4/2005 | Takahashi et al. | 360/324.11 |
| 2005/0094317 | A1 * | 5/2005 | Funayama | 360/313 |

* cited by examiner

*Primary Examiner*—Angel Castro
(74) *Attorney, Agent, or Firm*—Sonnenschein, Nath & Rosenthal LLP

(57) ABSTRACT

There are provided a magnetoresistive effect element having a satisfactory magnetic characteristic and a magnetic memory device including this magnetoresistive effect element to produce excellent write/read characteristics.

A magnetoresistive effect element 1 has a pair of ferromagnetic layers (magnetization fixed layer 5 and magnetization free layer 7) opposed to each other through an intermediate layer 6 to produce a magnetoresistive change by a current flowing to the direction perpendicular to the film plane, the magnetization free layer having a normalized resistance ranging from 2000 $\Omega nm^2$ to 10000 $\Omega nm^2$ where a product of a specific resistance obtained when a current flows to the film thickness direction of the magnetization free layer 7 and a film thickness is defined as the normalized resistance. A magnetic memory device includes this magnetoresistive effect element 1 and bit lines and word lines sandwiching the magnetoresistive effect element 1.

3 Claims, 5 Drawing Sheets

MAGNETORESISTIVE EFFECT ELEMENT AND MAGNETIC MEMORY DEVICE

RELATED APPLICATION DATA

The is a continuation of U.S. application Ser. No. 10/486,737 filed Feb. 11, 2004 now U.S. Pat. No. 6,879,473 which is a 371 of PCT/JP03/07495 filed Jun. 12, 2003 which claims priority to Japanese Application No. P2002-178963 filed Jun. 19, 2002, all of which are incorporated herein by reference to the extent permitted by law.

TECHNIAL FIELD

The present invention relates to a magnetoresistive effect element capable of producing a magnetoresistive change by a current flowing to the direction perpendicular to the film plane and a magnetic memory device including this magnetoresistive effect element.

BACKGROUND ART

As information communication devices, in particular, personal small devices such as personal digital assistants are making great spread, elements such as memories and logic devices comprising information communication devices are requested to become higher in performance such as becoming higher in integration degree, higher in operation speed and becoming lower in power consumption. In particular, technologies for making nonvolatile memories become higher in density and larger in storage capacity are progressively increasing their importance as technologies for replacements for hard disks and optical discs that cannot be essentially miniaturized because the hard disks and the optical discs cannot remove their movable portions.

As nonvolatile memories, there may be enumerated a flash memory using a semiconductor and an FRAM (Ferro electric Random Access Memory) using a ferroelectric material and the like. On the other hand, a problem has been pointed out, in which the FRAM cannot be rewritten so many times.

As a nonvolatile memory that has received a remarkable attention because it can overcome these shortcomings, there is known a magnetic memory called an MRAM (Magnetic Random Access Memory) which had been written in "Wang et al., IEEE Trans. Magn. 33(1997), 4498". Since this MRAM is simple in structure, it can be easily integrated at a higher integration degree. Moreover, since it is able to record information based upon the rotation of magnetic moment, it can be rewritten many times. It is also expected that the access speed of this magnetic random access memory will be very high, and it was already confirmed that this magnetic random access memory can be operated at operation speed in the order of nanoseconds.

A magnetoresistive effect element for use with this MRAM, in particular, a tunnel magnetoresistive effect (Tunnel Magnetoresistive: TMR) element has a fundamental arrangement of a lamination layer structure composed of ferromagnetic layer/tunnel barrier layer/ferromagnetic layer. This element generates magnetoresistive effect in response to a relative angle between the magnetizations of the two magnetic layers when an external magnetic field is applied to the ferromagnetic layers under the condition in which a constant current is flowing through the ferromagnetic layers. When the magnetization directions of the two ferromagnetic layers are anti-parallel to each other, a resistance value is maximized. When they are parallel to each other, a resistance value is minimized. This magnetic random access memory can function as the memory element when the anti-parallel state and the parallel state are created with application of external magnetic fields.

In particular, in a spin-valve type TMR element, when one ferromagnetic layer is antiferromagnetically coupled to the adjacent antiferromagnetic layer, one ferromagnetic layer is served as a magnetization fixed layer of which the magnetization direction is constantly made constant. The other ferromagnetic layer is served as a magnetization free layer of which the magnetization direction can easily be inverted with application of external magnetic fields and the like. Then, this magnetization free layer serves as an information recording layer in the magnetic memory.

In the spin-valve type TMR element, the changing ratio of the resistance value may be expressed by the following equation (1) where P1, P2 represent spin polarizabilities of the respective ferromagnetic layers.

$$2P1P2/(1-P1P2) \qquad (1)$$

As described above, the resistance changing ratio increases as the respective spin polarizabilities increase.

With respect to relationships among materials for use with the ferromagnetic layers and this resistance changing ratio, those relationships concerning ferromagnetic chemical elements of Fe group such as Fe, Co, Ni and alloys of these three kinds have been reported so far.

As is disclosed in Japanese laid-open patent application No. 10-116490 and the like, for example, the MRAM has a fundamental arrangement comprising a plurality of bit write lines (so-called bit lines), a plurality of word write lines (so-called word lines) perpendicular to those bit write lines and TMR elements disposed at intersection points between these bit write lines and word write lines as magnetic memory elements. Then, when information is written (information is recorded on) in such MRAM, information is selectively to be written in the TMR element by utilizing an asteroid property.

As the write line for writing information, there is used a conductive thin film, such as Cu and Al, which is generally used in semiconductors. For example, in order to write information in an element of which inverted magnetic field is 200 Oe by a write line having a width of 0.25 $\mu$m, a current of about 2 mA was required. When the thickness of the write line is identical to the line width, a current density obtained at that time reaches $3.2 \times 10^6$ A/cm$^2$, and reaches approximately a limit value of breaking wire by electromigration. Due to a problem of heat generated by a write current and from a standpoint of reducing power consumption, it is necessary to decrease this write current.

As a method of realizing reduction of the write current in the MRAM, there may be enumerated a method of decreasing a coercive force of the TMR element. The coercive force of the TMR element may properly be determined based upon selection of suitable factors such as the dimension and shape of the element, the film arrangement and the material.

However, when the TMR element is microminiaturized in order to increase the recording density of the MRAM, for example, a disadvantage arises, in which the coercive force of the TMR element increases unavoidably.

Therefore, in order to microminiaturize the MRAM (to increase the integration degree of the magnetic random-access memory) and to decrease the write current at the same time, the decrease of the coercive force of the TMR element should be attained from the materials standpoint.

If the magnetic property of the TMR element is dispersed at every element in the MRAM and the magnetic property is dispersed when the same element is in repeated use, then a problem arises, in which it becomes difficult to selectively write information in the magnetic random-access memory by using the asteroid property.

In consequence, the TMR element is requested to have a magnetic property by which an ideal asteroid curve can be drawn.

In order to draw the ideal asteroid curve, an R-H (resistance-magnetic field) curve obtained when the TMR is measured should remove noises such as a Barkhausen noise, a rectangle property of a waveform should be excellent, the magnetization state should be stable and the dispersions of the coercive force Hc should be small.

On the other hand, information will be read out from the TMR element in the MRAM as follows. When magnetic moments of one ferromagnetic layer and the other ferromagnetic layer across the insulating layer are anti-parallel to each other and the resistance value is high, this state is referred to as a "1", for example. Conversely, when the respective magnetic moments are parallel to each other, this state is referred to as a "0". Then, it is customary to read out information from the tunnel magnetoresistive effect element based upon a difference current between these states by using a constant voltage source.

Therefore, when the dispersions of resistance values between the elements are identical to each other, higher the TMR ratio (magnetoresistive changing ratio) becomes, the tunnel magnetoresistive effect element becomes more advantageous. Thus, the magnetoresistive effect element which can operate at high speed, may have a high integration degree and which may have a low error rate can be realized.

A bias voltage dependence of a TMR ratio exists in the TMR element having the fundamental structure of ferromagnetic layer/tunnel insulating layer/ferromagnetic layer, and it is known that the TMR ration decreases as the bias voltage increases. Since it is known that the TMR ratio takes the maximum value of the read signal near a voltage (Vh) halved by the bias voltage dependence in most cases, a small bias voltage dependence is effective for decreasing read errors.

In consequence, the TMR element for use with the MRAM should satisfy the above-mentioned write characteristic requirements and read characteristic requirements at the same time.

However, when the materials of the ferromagnetic layers of the TMR ratio are selected, if the alloy compositions by which the spin polarizabilities shown by P1 and P2 in the equation (1) are increased are selected from the materials made of only ferromagnetic transition metal chemical elements of Co, Fe, Ni, then the coercive force Hc of the TMR element generally tends to increase.

When the magnetization free layer (free layer), i.e., information recording layer is made of a $Co_{75}Fe_{25}$ (atomic %) alloy and the like, for example, although the spin polarizabilities may be large and a TMR ratio of 40% or higher can be maintained, it is unavoidable that the coercive force Hc also increases.

When the information recording layer is made of an $Ni_{80}Fe_{20}$ (atomic %) alloy which is what might be called a permalloy known as a soft magnetic material and the like instead of the above-mentioned alloy, although the coercive force Hc can be decreased, the spin polarizabilities are low as compared with those of the above-mentioned $Co_{75}Fe_{25}$ (atomic %) alloy so that the TMR ratio is lowered up to approximately 33%.

Further, when the information recording layer is made of a $Co_{90}Fe_{10}$ (atomic %) alloy having an intermediate property between those of the alloys of the above-mentioned two compositions, although a TMR ratio of about 37% can be obtained and the coercive force Hc can be suppressed to approximately an intermediate value between the coercive force of the above-mentioned $Co_{75}Fe_{25}$ (atomic %) alloy and the coercive force of the above-mentioned $Ni_{80}Fe_{20}$(atomic %) alloy, the magnetoresistive effect element has a poor rectangle property of an R-H loop, and an asteroid property by which information can be written in the magnetoresistive effect element cannot be obtained.

In order to solve the above-mentioned problems, it is an object of the present invention to provide a magnetoresistive effect element having a satisfactory magnetic property and a magnetic memory device including this magnetoresistive effect element and which has excellent write/read characteristics.

DISCLOSURE OF THE INVENTION

A magnetoresistive effect element according to the present invention has an arrangement composed of a pair of ferromagnetic layers opposed to each other through an intermediate layer to produce a magnetoresistive change by a current flowing in the direction perpendicular to the film plane and in which one of the ferromagnetic layers is a magnetization fixed layer, the other ferromagnetic layer being a magnetization free layer. When it is defined that a product of a specific resistance obtained when a current flows in the film thickness direction and a film thickness should be a normalized resistance, this normalized resistance is selected so as to fall within the range of from 2000 $\Omega nm^2$ to 10000 $\Omega nm^2$.

A magnetic memory device of the present invention comprises a magnetoresistive effect element designed to have a ferromagnetic tunnel junction sandwiching a tunnel barrier layer between a pair of ferromagnetic layers so as to cause a current to flow in the direction perpendicular to the film plane and word lines and bit lines sandwiching this magnetoresistive effect element in the thickness direction and in which one of the ferromagnetic layers is a magnetization fixed layer, the other ferromagnetic layer being a magnetization free layer. When it is defined that a product of a specific resistance obtained when a current flows in the film thickness direction and a film thickness should be a normalized resistance, this normalized resistance is selected so as to fall within a range of from 2000 $\Omega nm^2$ to 10000 $\Omega nm^2$.

According to the above-mentioned arrangement of the magnetoresistive effect element of the present invention, when it is defined that the product of the specific resistance obtained when the current flows in the film thickness direction and the film thickness should be the normalized resistance, since this normalized resistance falls within the range of from 2000 $\Omega nm^2$ to 10000 $\Omega nm^2$, the magnetization free layer becomes able to increase the frequency characteristic against the external magnetic field, to increase the magnetoresistive changing ratio (magnetoresistive ratio) and to improve the rectangle property of the resistance-external magnetic field curve.

Moreover, the bias voltage dependence of the magnetoresistive changing ratio (magnetoresistive ratio) can be increased, and the dispersions of the coercive force can be improved.

According to the above-mentioned arrangement of the magnetic memory device of the present invention, since this magnetic memory device includes the magnetoresistive effect element and the word lines and the bit lines, sandwiching the magnetoresistive effect element in the thickness direction and the magnetoresistive effect element has the above-described arrangement of the magnetoresistive effect element of the present invention, since magnetic properties of the magnetoresistive effect element, such as the frequency characteristic against the external magnetic field, the magnetoresistive ratio, the rectangle property of the resistance-external magnetic field curve, the bias voltage dependence and the dispersions of the coercive force can be improved, it is possible to decrease information write and read errors.

BEST MODE FOR CARRYING OUT THE INVENTION

According to the present invention, there is provided a magnetoresistive effect element having an arrangement composed of a pair of ferromagnetic layers opposed to each other through an intermediate layer to produce a magnetoresistive change by a current flowing in the direction perpendicular to the film plane and in which one of the ferromagnetic layers is a magnetization fixed layer, the other ferromagnetic layer being a magnetization free layer. When it is defined that a product of a specific resistance obtained when a current flows in the film thickness direction and a film thickness should be a normalized resistance, this normalized resistance is selected so as to fall within a range of from 2000 $\Omega nm^2$ to 1000 $\Omega nm^2$.

According to the present invention, the above-described magnetoresistive effect element is a tunnel magnetoresistive effect element using a tunnel barrier layer made of an insulating material or a semiconductor material as an intermediate layer.

According to the present invention, the above-described magnetoresistive effect element is constituted by including a lamination layer ferri structure.

According to the present invention, there is provided a magnetic memory device comprising a magnetoresistive effect element designed to have a ferromagnetic tunnel junction sandwiching a tunnel barrier layer between a pair of ferromagnetic layers so as to cause a current to flow in the direction perpendicular to the film plane and word lines and bit lines sandwiching this magnetoresistive effect element in the thickness direction and in which one of the ferromagnetic layers is a magnetization fixed layer, the other ferromagnetic layer being a magnetization free layer. When it is defined that a product of a specific resistance obtained when a current flows in the film thickness direction and a film thickness should be a normalized resistance, this normalized resistance is selected so as to fall within a range of from 2000 $\Omega nm^2$ to 10000 $\Omega nm^2$.

Further, according to the present invention, in the above-described magnetic memory device, the magnetoresistive effect element is a tunnel magnetoresistive effect element using a tunnel barrier layer made of an insulating material or a semiconductor material as an intermediate layer.

Furthermore, according to the present invention; in the above-described magnetic memory device, the magnetoresistive effect element has a lamination layer ferri structure.

Figure 1:
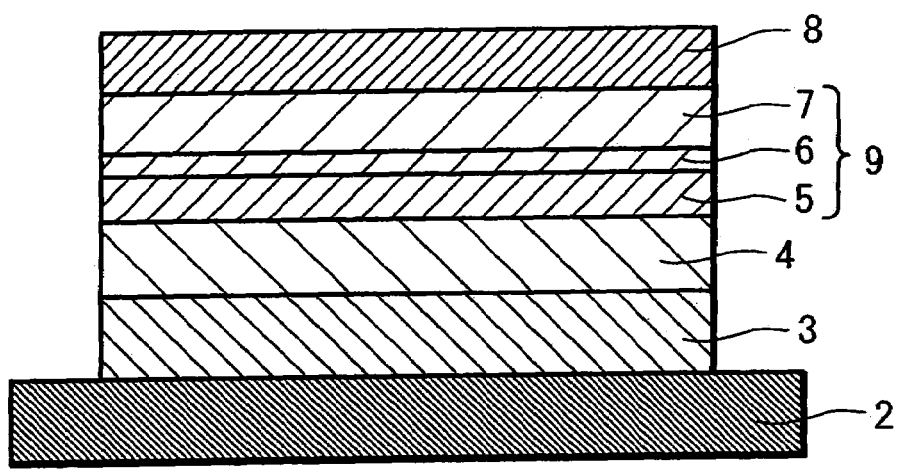
FIG. 1 is a schematic diagram showing an arrangement of a TMR element according to an embodiment of the present invention.

FIG. 1 is a schematic diagram showing an arrangement of a magnetoresistive effect element according to an embodiment of the present invention. The embodiment shown in FIG. 1 shows the case in which the present invention is applied to a tunnel magnetoresistive effect element (hereinafter referred to as a "TMR element").

This TMR element 1 has a substrate 2 made of a suitable material such as silicon on which an underlayer 3, an anti ferromagnetic layer 4, a magnetization fixed layer 5 which is a ferromagnetic layer, a tunnel barrier layer 6, a magnetization free layer 7 which is a ferromagnetic layer, and a top-coat layer 8 are laminated, in that order.

Specifically, this magnetoresistive effect element fabricates a so-called spin-valve type TMR element in which one of the ferromagnetic layers serves as the magnetization fixed layer 5, the other one serving as the magnetization free layer 7. The magnetization fixed layer 5 and the magnetization free layer 7 which are the pair of ferromagnetic layers sandwich the tunnel barrier layer 6 to form a ferromagnetic tunnel junction 9.

Then, when this TMR element 1 is applied to this magnetic memory device or the like, the magnetization free layer 7 serves as an information recording layer on which information is to be recorded.

The antiferromagnetic layer 4 is antiferromagnetically coupled to the magnetization fixed layer 5 which is one of the ferromagnetic layers to serve as a layer which can inhibit the magnetization of the magnetization fixed layer 5 from being inverted with application of magnetic fields of a write current and which can make the magnetization direction of the magnetization fixed layer 5 become constant constantly. Specifically, in the TMR element 1 shown in FIG. 1, the magnetization direction of only the magnetization free layer 7 which is the other ferromagnetic layer is inverted with application of external magnetic fields and the like. The magnetization free layer 7 becomes to serves as a layer on which information is to be recorded when the TMR element 1 is applied to a suitable device such as a magnetic memory device, and hence is referred to as an "information recording layer".

As materials to construct the antiferromagnetic layer 4, there can be used Mn alloy, Co oxide, Ni oxide containing Fe, Ni, Pt, Ir, Rh and the like.

Ferromagnetic materials to construct the magnetization fixed layer 5 are not limited to particular materials but can use an alloy material made of one kind or more than two kinds of iron, nickel and cobalt.

In the spin-valve type TMR element 1 shown in FIG. 1, the magnetization fixed layer 5 is antiferromagnetically coupled to the antiferromagnetic layer 4 and thereby the magnetization direction. thereof is made constant. Therefore, the magnetization direction of the magnetization fixed layer 5 is inhibited from being inverted with application of magnetic fields generated by a current required when information is written in this magnetic memory device.

The tunnel barrier layer 6 is a layer not only used to magnetically separate the magnetization fixed layer 5 and the magnetization free layer 7 from each other but also to cause a tunnel current to flow therethrough.

As materials to construct the tunnel barrier layer 6, there can be used insulating materials such as oxide, nitride and halide of Al, Mg, Si, Li, Ca and the like.

Such tunnel barrier layer 6 can be obtained by oxidizing or nitriding a metal film deposited by a sputtering method or a vapor deposition method.

Alternatively, the tunnel barrier layer can also be obtained by a CVD method using organic metals, oxygen, ozone, nitrogen, halogen, halogenated gas and the like.

In this embodiment, when the product of the specific resistance and film thickness of, in particular, the magnetization free layer 7 is to be defined as the normalized resistance, the normalized resistance of this magnetization free layer is selected so as to fall within a range of from 2000 $\Omega nm^2$ to 10000 $\Omega nm^2$.

According to this arrangement, the frequency characteristic against the external magnetic field can be increased, the magnetoresistive changing ratio (TMR ratio) can be increased, the rectangle property of the resistance-external magnetic field curve can be improved, the dispersions of the coercive force can be improved, and the bias voltage dependence can be improved.

Insofar as the magnetoresistive effect element has the arrangement made of the ferromagnetic material which may fall within the range of such normalized resistance, the composition and arrangement of the magnetization free layer 7 are not limited to particular ones, but metals, alloys and other materials can be used. Moreover, the magnetization free layer may be formed of either the monolayer film or the lamination layer film.

When the magnetization free layer 7 is composed of the lamination layer film, a total normalized resistance of the, lamination layer film may fall within the above-mentioned range.

According to the above-mentioned TMR element 1 of this embodiment, when the product of the specific resistance and the film thickness of the magnetization free layer 7 is defined as the normalized resistance, the normalized resistance of this magnetization free layer 7 is selected so as to fall within the range of from 2000 $\Omega nm^2$ to 10000 $\Omega nm^2$, whereby the frequency characteristic against the external magnetic field can be increased, the magnetoresistive changing ratio (TMR ratio) can be increased, the rectangle property of the resistance-external magnetic field curve can be improved, the dispersions of the coercive force can be improved, and the bias voltage dependence can be improved.

Thus, when the TMR element 1 is applied to the magnetic memory device composed of a large number of TMR elements, stability of operations of the magnetic memory device can be improved. Also, when information is read out from the memory device, the bias voltage dependence of the TMR ratio can be improved and the low-resistance state and the high-resistance state can be discriminated from each other, thereby resulting in the read characteristic being improved.

When information is written in the magnetic memory device, since noises are decreased from the resistance-external magnetic field curve and the asteroid curve shape (asteroid property) of the TMR element 1 can be improved, write errors can be decreased and the write characteristic can be improved.

In the present invention, the magnetoresistive effect element is not limited to the TMR element 1 in which each of the magnetization fixed layer 5 and the magnetization free layer 7 shown in FIG. 1 is composed of the single layer.

Figure 2:
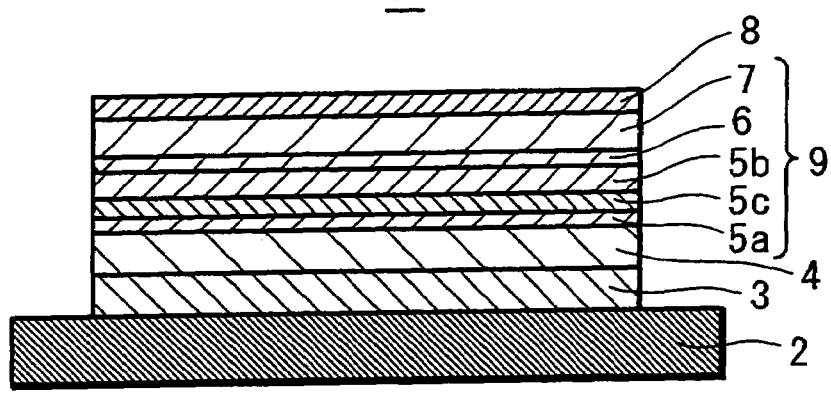
FIG. 2 is a schematic diagram showing an arrangement of a TMR element including a lamination layer ferri structure.

As shown in FIG. 2, for example, even when the magnetization fixed layer 5 the lamination layer ferri structure in which a nonmagnetic conductive layer 5c is sandwiched by first and second magnetization fixed layers 5a and 5b, the effects of the present invention can be achieved.

In a TMR element 10 shown in FIG. 2, the first magnetic fixed layer 5a is adjoining the antiferromagnetic layer 4 and hence the first magnetization fixed layer 5a is given strong magnetic anisotropy of one direction by exchange interaction. Moreover, since the second magnetization fixed layer 5b is opposed to the magnetization free layer 7 through the tunnel barrier layer 6 and the spin direction is compared with that of the magnetization free layer 7 so that this second magnetization fixed layer serves as the ferromagnetic layer which is directly related to the MR ratio, it is also referred to as a "reference layer".

As materials for use with the nonmagnetic conductive layer 5c having the lamination layer ferri structure, there may be enumerated Ru, Rh, Ir, Cu, Cr, Au, Ag and the like. In the TMR element 10 shown in FIG. 2, since other layers have arrangements substantially similar to those of the TMR element 1 shown in FIG. 1, they are denoted by identical reference numerals to those of FIG. 1 and therefore need not be described in detail.

Also in the TMR element 10 having this lamination layer ferri structure, the normalized resistance of the magnetization free layer, 7 is selected so as to fall within the range of from 2000 $\Omega nm^2$ to 10000 $\Omega nm^2$, whereby the rectangle property of the resistance-external magnetic field curve can be improved and the Barkhausen noise can be decreased similarly to the TMR element 1 shown in FIG. 1. Moreover, the dispersions of the coercive force Hc can be suppressed and hence the asteroid curve shape of the TMR element 10 can be improved.

While the TMR elements (tunnel magnetoresistive effect elements) 1, 10 are used as the magnetoresistive effect element in the above-mentioned embodiment, the present invention can also be applied to other magnetoresistive effect elements having a pair of ferromagnetic layers opposed to each other through an intermediate layer to produce a magnetoresistive change by a current flowing in the direction perpendicular to the film plane.

The present invention can also be applied to a giant magnetoresistive effect element (GMR element) using a nonmagnetic conductive layer made of a suitable material, such as Cu, as an intermediate layer, for example, to produce a magnetoresistive effect by a current flowing in the direction perpendicular to the film plane, i.e., so-called CPP type GMR element.

The materials of the magnetization fixed layer and the antiferromagnetic material, the presence or absence of the antiferromagnetic material layer, the presence or absence of the lamination ferri structure on the side of the magnetization fixed layer can be variously modified so long as such modifications do not spoil the essence of the present invention.

The magnetoresistive effect element such as the above-mentioned TMR elements 1, 10 are suitable for use with the magnetic memory device such as an MRAM. An MRAM using the TMR element according to the present invention will be described below with reference to the drawings.

Figure 3:
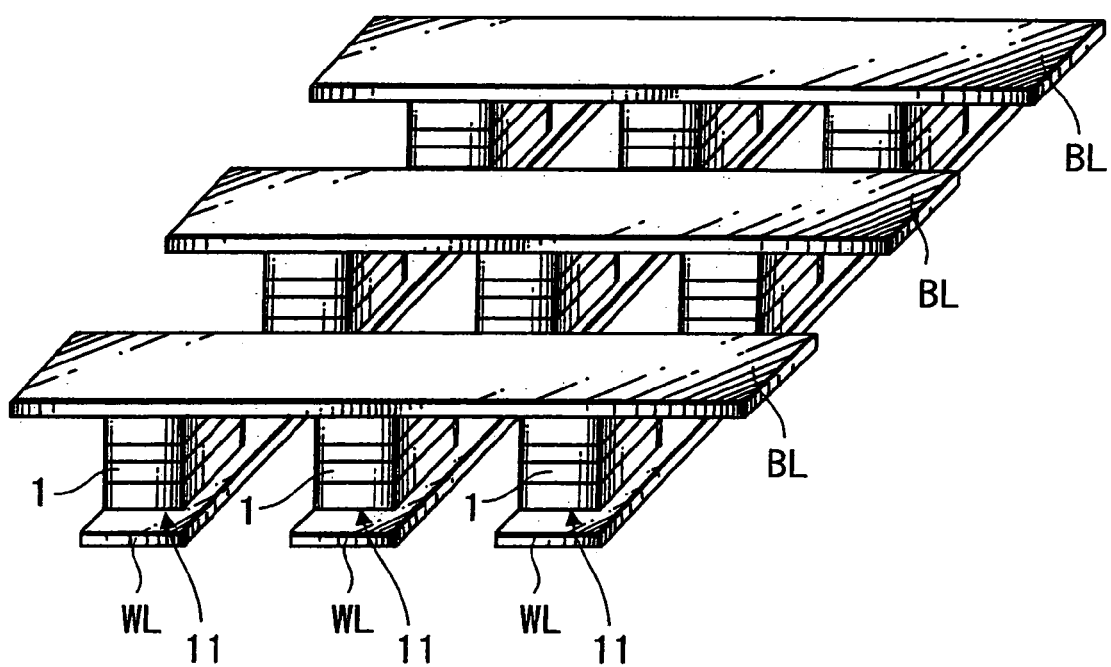
FIG. 3 is a schematic diagram of an arrangement showing a main portion of a cross-point type MRAM array including the TMR element of the present invention as a memory cell.

A cross-point type MRAM array including the TMR element according to the present invention is illustrated in FIG. 3. This MRAM array includes a plurality of word lines WL, a plurality of bit lines BL crossing these word lines WL at a right angle and memory cells 11 provided by locating the TMR elements of the present invention at intersection points between the word lines WL and the bit lines BL. Specifically, in this MRAM array, 3×3 memory cells 11 are disposed in a matrix fashion.

The TMR element for use with the MRAM array is not limited to the TMR element 1 shown in FIG. 1 and a magnetoresistive effect element, such as the TMR element 10 having the lamination layer ferri structure shown in FIG. 2, having the arrangement to produce the magnetoresistive change by a current flowing in the direction perpendicular to the film plane may have any arrangement so long as the normalized resistance of the magnetization free layer there of may fall within the above-mentioned specific range.

Figure 4:
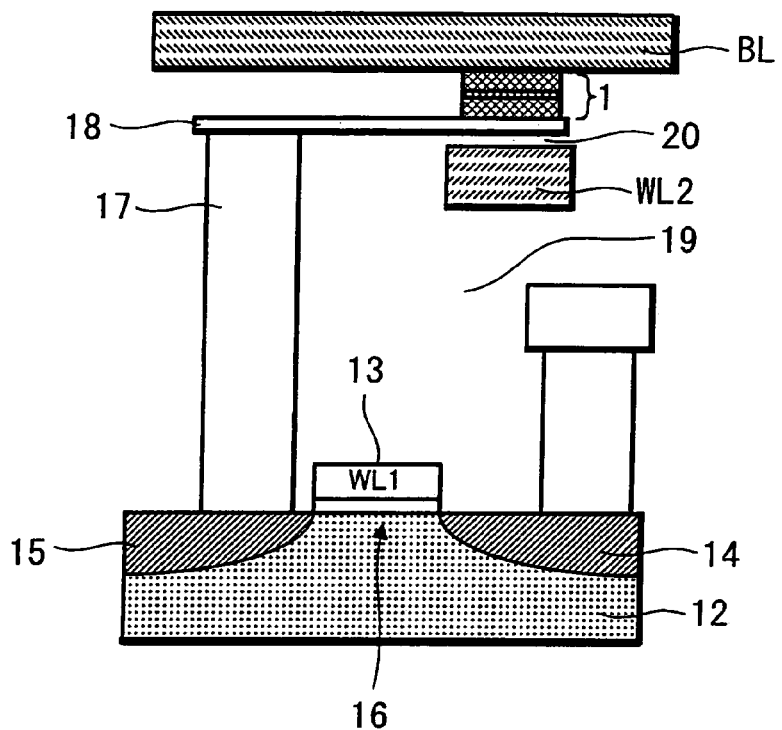
FIG. 4 is an enlarged cross-sectional view of the memory cell shown in FIG. 3.

One memory cell is picked up from a large number of memory cells in the memory element and its cross-sectional structure is illustrated in FIG. 4.

As shown in FIG. 4, each memory cell 11 includes a silicon substrate 12, for example, on which a transistor 16 composed of a gate electrode 13, a source region 14 and a drain region 15, is formed. The gate electrode 13 constructs a read word line WL1. The gate electrode 13 has a write word line (equivalent to the aforementioned word write line) WL2 formed thereon through an insulating layer. A contact metal 17 is connected to the drain region 15 of the transistor 16, and an underlayer 18 is connected to the contact metal 17. The underlayer 18 has the TMR element 1 of the present invention formed thereon at its position corresponding to the above portion of the write word line WL2. On this TMR element 1, there is formed a bit line (equivalent to the aforementioned bit write line) BL that intersects the word lines WL1 and WL2 at a right angle. The underlayer 18 plays a role of electrically connecting the TMR element 1 and the drain region 15 which are different in position on the plane, and is therefore referred to as a "bypass".

This memory cell further includes an interlayer insulator 19 and an insulating layer 20 for insulating the respective word lines WL1, WL2 and the TMR element 1, a passivation film (not shown) for protecting the whole of the memory cell and the like.

Since this MRAM uses the TMR element 1 having the arrangement in which the normalized resistance of the magnetization free layer 7 may fall within the above-mentioned specific range, the bias voltage dependence of the TMR ratio of the TMR element 1 can be improved, the low-resistance state and the high-resistance state can easily be discriminated from each other and the read error can be decreased. Moreover the noise can be decreased from the resistance-external magnetic curve (R-H curve) and the asteroid property can be improved, and therefore the write error can be decreased.

INVENTIVE EXAMPLES

Specific inventive examples to which the present invention is applied will be described below with reference to experiment results.

Figure 5:
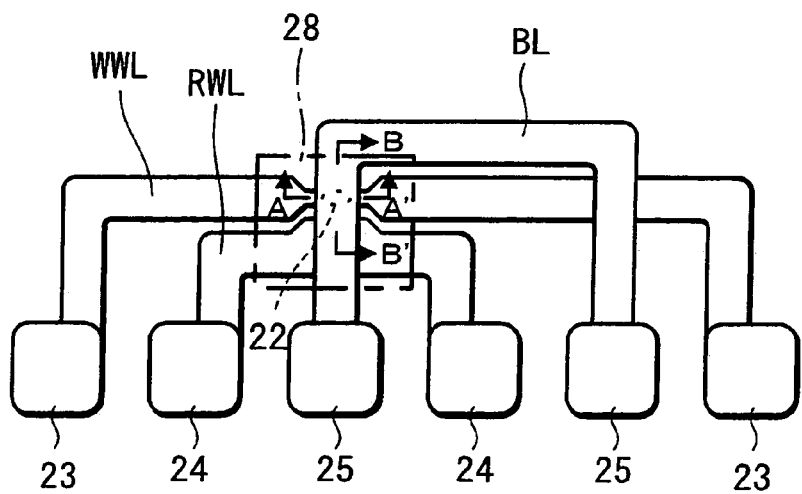
FIG. 5 is a plan view of a TEG to evaluate the TMR element.
Figure 6A:
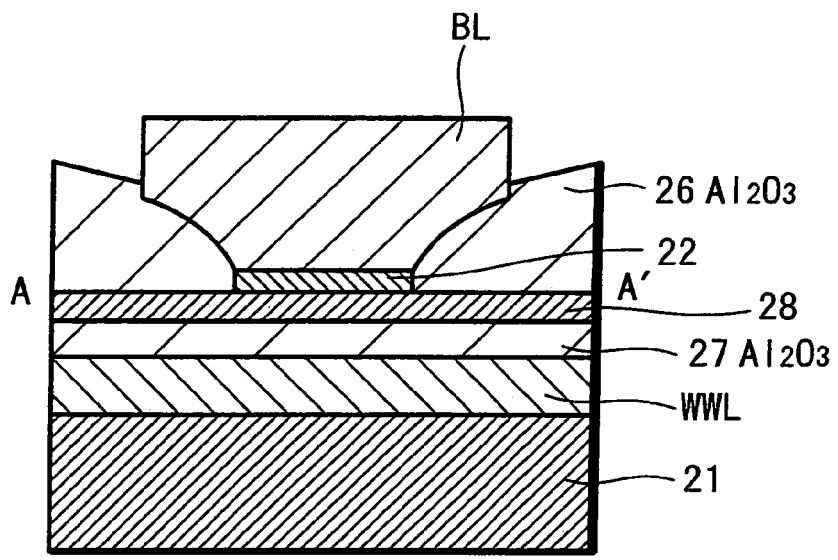
FIG. 6A is a cross-sectional view taken along the line A–A' in FIG. 5.
Figure 6B:
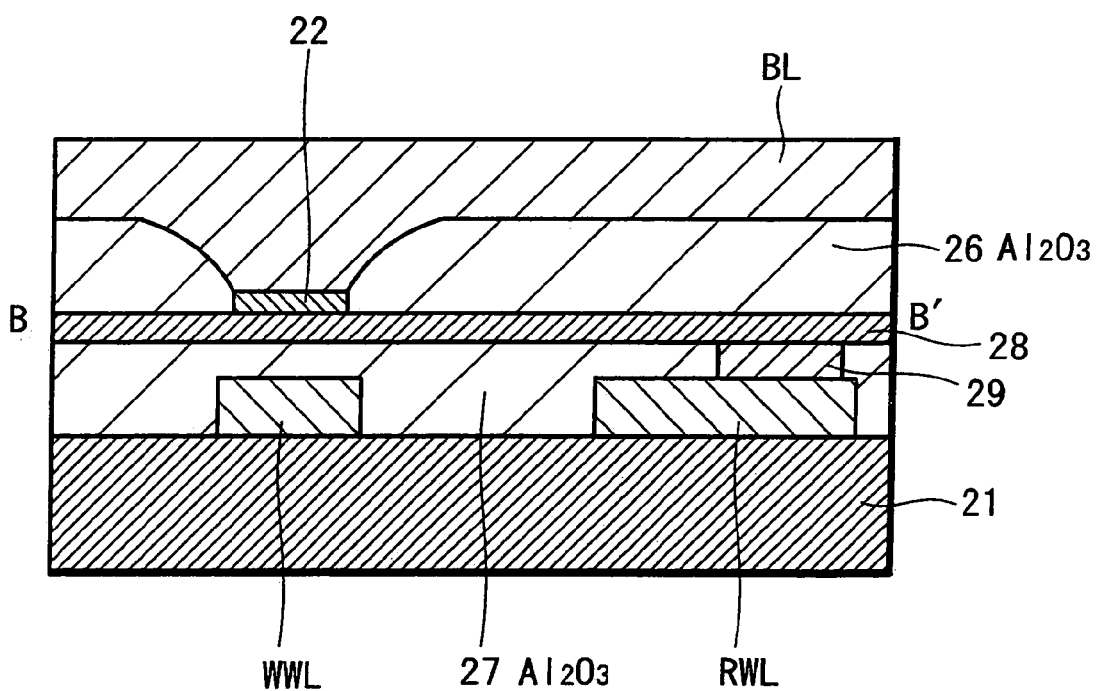
FIG. 6B is a cross-sectional view taken along the line B–B' in FIG. 5.

While the MRAM includes the switching transistor 16 in addition to the TMR element 1 as shown in FIG. 4, according to the inventive examples, in order to examine TMR properties, those properties had been measured/evaluated by using a wafer on which only a ferromagnetic tunnel junction was formed as shown in FIGS. 5 and 6. FIG. 5 is a plan view, FIG. 6A is a cross-sectional view taken along the line A—A' in FIG. 5, and FIG. 6B is a cross-sectional view taken along the line B—B' in FIG. 5.

Then, while compositions and film thicknesses of the magnetization free layer in the ferromagnetic tunnel junction were being modified variously, samples were fabricated and magnetic properties of the respective samples were examined.

<Sample 1>

As shown in FIGS. 5 and 6, as a property evaluation element TEG (Test Element Group), there was fabricated a structure comprising a substrate 21 with a bit line BL and two word lines WWL, RWL disposed thereon so as to cross each other at a right angle and a TMR element 22 disposed at a portion in which one word line WWL and bit line BL cross each other. Of the two word lines WWL, RWL, the word lined is posed on the plane different from that of the TMR element 22 serves as the write line WWL and the other word line serves as the read line RWL. The TMR element 22 and the read line RWL are electrically connected to each other through a bypass film 28 and a contact layer 29.

In this TEG, the TMR element 22 is shaped like an ellipse having a minor axis of 0.5 $\mu$m and a major axis of 1.0 $\mu$m, and terminal pads 23, 24 and 25 are respectively formed on both ends of the word lines WWL, RWL and the bit line BL. The word lines WWL, RWL and the bit line BL are electrically insulated from each other by insulating films 26, 26 made of $Al_2O_3$ films.

Also in the TEG having this arrangement, similarly to the case in which the TMR element is applied to the magnetic memory device, the magnetization of the magnetic free layer of the TMR element 22 is inverted with application of current magnetic fields.

Then, the magnetization free layer can be swept in a range of from −1500 Oe to +1500 Oe by a current flowing through the write line WWL.

To be concrete, the TEG shown in FIGS. 5 and 6 was fabricated as follows.

First, there was prepared a silicon substrate 2 having a thickness of 2 mm in which a heat oxide film (having a thickness of 2 $\mu$m) was formed on the surface.

Next, a Cu film was deposited on this substrate 21 as a word line material. After this deposited film has been masked by photolithography, the two word lines WWL, RWL were formed by selectively. etching other portions than the word lines according to Ar plasma. At that time, other regions than the word lines WWL, RWL were etched up to the depth of 5 nm of the substrate 21.

Thereafter, the insulating film 27 having a thickness of about 100 nm was formed so as to cover the word lines WWL, RWL and the surface was made flat. At that time, the insulating film 27 is formed in the portions other than the portions in which the word line measurement pads 23, 24, the read line RWL and the contact layer 29 for the TMR element are formed.

Subsequently, the TMR element 22 having the following film arrangement (A) was fabricated by a well-known lithography method and etching. In the film arrangement (A) the left-hand side of slash represents the substrate side and numerical values within the parentheses represent film thicknesses.

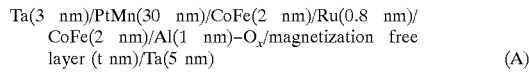

In the above-described film arrangement (A), the composition of the magnetization free layer was selected to be $Co_{75}Fe_{25}$ (atomic %), to be 3 nm. At that time, since the specific resistance of the magnetization free layer was 115 Ωnm, the normalized resistance of the magnetization free layer reached 345 Ωnm².

Moreover, the composition of each CoFe film was selected to be $Co_{90}Fe_{10}$ (atomic %).

The Al—$O_x$ film of the tunnel barrier layer was formed as follows. First, a metal Al film having a thickness of 1 nm was deposited by a DC sputtering method. Then, the above film was formed by plasma-oxidizing the metal Al film with application of plasma ions from an ICP (inductive coupled plasma) under the conditions in which a flow rate of oxygen/argon gas was selected to be 1:1, a chamber gas pressure being selected to be 0.1 mTorr. Although the oxidation time can be varied depending upon the ICP plasma output, it was selected to be 30 seconds in this inventive example.

Moreover, films other than the Al—$O_x$ film of the tunnel barrier layer 6 were deposited by a DC magnetron sputtering method.

Next, the resultant sample was annealed with application of magnetic field of 10 kOe at 270° C. for 4 hours in a field anneal furnace and a ferromagnetic tunnel junction 9 was formed by effecting a normalizing-annealing treatment on the PtMn layer which is the antiferromagnetic layer.

Further, after a range of 50 μm×75 μm including the contact portion of the read line RWL and the TMR film (the flat surface pattern of the bypass layer 28 becomes this range finally) has been masked by photolithography, the sample was selectively etched up to just above the Cu layer by Ar plasma. Thus, the bypass layer 28 may have the film arrangement composed of Ta (3 nm)/PtMn (30 nm)/CoFe (2 nm)/Ru (0.8 nm)/CoFe (2 nm)/Al—$O_x$.

Next, after the portion which will serve as the TMR element 22 has been masked by photolithography, the sample was etched up to just above the tunnel barrier layer 6, thereby resulting in the TMR element 22 including the flat surface pattern shown in FIG. 5 being formed.

Subsequently, the insulating layer 26 having a thickness of about 100 nm was deposited by sputtering $Al_2O_3$ and other portions than the TMR element 22 were insulated by this insulating layer.

Further, the bit line BL and the measurement terminal pad 25 were formed by photolithography so as to contain the portion of the TMR element 22 and thereby the TEG shown in FIGS. 5 and 6 was obtained.

<Sample 2>

A TEG was obtained similarly to the sample 1 except that the composition of the magnetization free layer was selected to be $Ni_{81}Fe_{19}$ (atomic %) and that the film thickness of the magnetization free layer was selected to be 4 nm. At that time, since the specific resistance of the magnetization free layer is 233 Ωnm, the normalized resistance of the magnetization free layer becomes 932 Ωnm².

<Samples 3 to 8>

TEGs were obtained similarly to the sample 1 except that the composition of the magnetization free layer was selected to be $Co_{72}Fe_8B_{20}$ (atomic %) and that the film thickness of the magnetization free layer was selected to be 1 nm, 2 nm, 3 nm, 5 nm, 6 nm and 8nm, respectively. At that time, the specific resistance of the magnetization free layer is 1198 Ωnm.

<Samples 9 to 11>

TEGs were obtained similarly to the sample 1 except that the composition of the magnetization free layer was selected to be $Co_{81}Fe_9B_{20}$ (atomic %) and that the film thickness of the magnetization free layer was selected to be 3 nm, 4 nm and 5 nm, respectively. At that time, the specific resistance of the magnetization free layer is 983 Ωnm.

<Samples 12 to 14>

TEGs were obtained similarly to the sample 1 except that the composition of the magnetization free layer was selected to be $Co_{63}Fe_7B_{30}$ (atomic %) and that the film thickness of the magnetization free layer was selected to be 2 nm, 4 nm and 5 nm, respectively. At that time, the specific resistance of the magnetization free layer was 1305 Ωnm.

<Samples 15 to 17>

TEGs were obtained similarly to the sample 1 except that the composition of the magnetization free layer was selected to be $Co_{48}Fe_{32}B_{20}$ (atomic %) and that the film thickness of the magnetization free layer was selected to be 1 nm, 3 m and 5 nm, respectively. At that time, the specific resistance of the magnetization free layer is 1458 Ωnm.

<Samples 18 to 20>

TEGs were obtained similarly to the sample 1 except that the composition of the magnetization free layer was selected to be $Co_{60}Fe20B20$ (atomic %) and that the film thickness of the magnetization free layer was selected to be 1 nm, 4 nm and 5 nm, respectively. At that time, the specific resistance of the magnetization free layer is 1296 Ωnm.

<Samples 21 to 23>

TEGs were obtained similarly to the sample 1 except that the composition of the magnetization free layer was selected to be $Co_{40}Fe_{40}B_{20}$ (atomic %) and that the film thickness of the magnetization free layer was selected to be 3 nm, 4 nm and 5 nm, respectively. At that time, the specific resistance of the magnetization free layer is 1552 Ωnm.

<Sample 24>

A TEG was obtained similarly to the sample 1 except that the composition of the magnetization free layer was selected to be $Co_{70}Fe_5Si_{10}B_{15}$ (atomic %) and that the film thickness of the magnetization free layer was selected to be 3 nm. At that time, since the specific. resistance of the magnetization free layer is 2004 "nm, the normalized resistance of the magnetization free layer becomes 6012 Ωnm².

<Samples 25 to 28>

TEGs were obtained similarly to the sample 1 except that the composition of the magnetization free layer was selected to be $Co_{75.3}Fe_{4.7}Si_4B_{16}$ (atomic %) and that the film thickness of the magnetization free layer was selected to be 2 nm, 3 nm, 4 nm and 5 nm, respectively. At that time, the specific resistance of the magnetization free layer is 2453 Ωnm.

<Samples 29 to 32>

TEGs were obtained similarly to the sample 1 except that the composition of the magnetization free layer was selected to be $Co_{65.7}Fe_{4.3}Si_{17}B_{13}$ (atomic %) and that the film thickness of the magnetization free layer was selected to be 2 nm, 3 nm, 4 nm and 5 nm, respectively. At that time, the specific resistance of the magnetization free layer is 2241 Ωnm.

<Samples 33 to 36>

TEGs were obtained similarly to the sample 1 except that the composition of the magnetization free layer was selected to be $Co_{67}Fe_4Si_{19}B_{10}$ (atomic %) and that the film thickness of the magnetization free layer was selected to be 2 nm, 3 nm, 4 nm and 5 nm, respectively. At that time, the specific resistance of the magnetization free layer is 2098 Ωnm.

<Sample 37>

A TEG was obtained similarly to the sample 1 except that the composition of the magnetization free layer was selected to be $Co_{61.6}Fe_{4.2}Ni_{4.2}Si_{10}B_{20}$ (atomic %) and that the film thickness of the magnetization free layer was selected to be 4 nm. At that time, since the specific resistance of the magnetization free layer is 2350 Ωnm, the normalized resistance of the magnetization free layer becomes 9400 $Ωnm^2$.

<Sample 38>

A TEG was obtained similarly to the sample 1 except that the composition of the magnetization free layer was selected to be $Co_{69.6}Fe_{4.6}Mo_{1.8}Si_8B_{16}$ and that the film thickness of the magnetization free layer was selected to be 4 nm. At that time, since the specific resistance of the magnetization free layer is 2865 Ωnm, the normalized resistance of the magnetization free layer becomes 11460 $Ωnm^2$.

<Sample 39>

A TEG was obtained similarly to the sample 1 except that the composition of the magnetization free layer was selected to be $Co_{70}Mn_6B_{24}$ (atomic %) and that the film thickness of the magnetization free layer was selected to be 4 nm. At that time, since the specific resistance of the magnetization free layer is 2713 Ωnm, then normalized resistance of the magnetization free layer becomes 10852 $Ωnm^2$.

<Sample 40>

A TEG was obtained similarly to the sample 1 except that the composition of the magnetization free layer was selected to be $Co_{81.5}Mo_{9.5}Zr_{9.0}$ (atomic %) and that the film thickness of the magnetization free layer was selected to be 4 nm. At that time, since the specific resistance of the magnetization free layer is 3075Ωnm, the normalized resistance of the magnetization free layer becomes 12300 $Ωnm^2$.

Then, the R-H curves of the TEGs of the thus obtained respective samples 1 to 40 were measured as follows. Further, the magnetoresistive changing ratios (TMR ratios), the dispersions of coercive forces obtained when they are measured repeatedly and the rectangle ratios were calculated from the R-H curves. Furthermore, the operation maximum frequencies and the bias voltage dependences were measured.

(Measurement of R-H Curve)

With a current flowing through the write line WWL, an external magnetic field to invert the magnetization of the magnetization free layer of the TMR element 22 is applied to the samples.

Next, the samples are swept in a range of from −1500 Oe to +1500 Oe from one side of the magnetization easy axes of the magnetization free layer, and a tunnel current flows through the ferromagnetic tunnel junction while the bias voltage applied to the terminal pad 23 of the write line WWL and the terminal pad 24 of the bit line BL may reach 100 mV. R-H curves were obtained by measuring resistance values relative to the respective external magnetic fields.

(Magnetoresistive Changing Ratio)

A magnetoresistive changing ratio (TMR ratio) was calculated from a resistance value obtained in the condition in which the magnetizations of the magnetization fixed layer and the magnetization free layer are in the anti-parallel state and in which the resistance is high and in the condition in which the magnetizations of the magnetization fixed layer and the magnetization free layer are in the parallel state and in which the resistance is low.

(Dispersions of Coercive Force Hc Obtained when Sample is Measured Repeatedly)

R-H curves were measured by the above-described method, and a mean value of resistance values obtained in the condition in which the magnetizations of the magnetization fixed layer and the magnetization free layer are in the anti-parallel state and in which the resistance is high and resistance values obtained in the condition in which the magnetizations of the magnetization fixed layer and the magnetization free layer are in the parallel state and in which the resistance is low was calculated from the R-H curve. Then, a value of an external magnetic field required when the resistance value of this mean value is obtained was determined as the coercive force Hc. Then, this coercive force Hc was repeatedly measured from the same element (TEG) 50 times to calculate a standard deviation ΔHc of those measured coercive forces. Then, ΔHc/(mean value of Hc) was determined as a value of the dispersion of the coercive force Hc.

(Rectangle Ratio)

A rectangle ratio of a waveform was calculated from the R-H curve. Specifically, a value (R2max−R2min)/(R1max−R1min), which is a ratio between R1max−R1min of the R-H curve obtained with application of a magnetic field ranging from −500 Oe to +500 Oe and R2max−R2min obtained without application of a magnetic field (H=0) upon measurement was calculated and the calculated value was determined as a rectangle ratio.

(Measurement of Operation Maximum Frequency)

A frequency obtained when a magnetoresistive changing ratio (TMR ratio) was lowered 3 dB while a frequency of a current for sweeping the write line WWL was being increased was calculated, and the calculated value was determined as an operation maximum frequency.

(Measurement of Bias Voltage Dependence)

While a bias voltage was being changed at every 10 mV in a range of from 100 to 1000 mV, the R-H curves we remeasured to calculate magnetoresistive changing ratios (TMR ratios).

Then, magnetoresistive changing ratios (TMR ratios) were plotted against the bias voltage, and a bias voltage that becomes half relative to the TMR ratio extrapolated at 0 mV was calculated. The thus calculated value was determined as Vhalf.

With respect to the respective samples 1 to 40, compositions, film thicknesses, specific resistances and normalized resistances of the magnetization free layers are shown on the table 1, and operation maximum frequencies, TMR ratios, dispersions of coercive force Hc when samples were repeatedly measured, rectangle ratios and Vhalf are shown on the table 2.

TABLE 1

| sample No. | Composition | Specific resistance (Ωnm) | Film thickness of magnetization free layer (nm) | Normalized resistance (Ωnm$^2$) |
|---|---|---|---|---|
| 1 | $Co_{75}Fe_{25}$ | 115 | 3 | 345 |
| 2 | $Ni_{81}Fe_{19}$ | 233 | 4 | 932 |
| 3 | $Co_{72}Fe_8B_{20}$ | 1198 | 1 | 1198 |
| 4 | | | 2 | 2396 |
| 5 | | | 3 | 3549 |
| 6 | | | 5 | 5990 |
| 7 | | | 6 | 7188 |
| 8 | | | 8 | 9584 |
| 9 | $Co_{71}Fe_9B_{20}$ | 983 | 3 | 2949 |
| 10 | | | 4 | 3932 |
| 11 | | | 5 | 4915 |
| 12 | $Co_{63}Fe_7B_{30}$ | 1305 | 2 | 2610 |
| 13 | | | 4 | 5220 |
| 14 | | | 5 | 6525 |
| 15 | $Co_{48}Fe_{32}B_{20}$ | 1458 | 1 | 1458 |
| 16 | | | 3 | 4374 |
| 17 | | | 5 | 7290 |
| 18 | $Co_{60}Fe_{20}B_{20}$ | 1296 | 1 | 1296 |
| 19 | | | 4 | 5184 |
| 20 | | | 5 | 6480 |
| 21 | $Co_{40}Fe_{40}B_{20}$ | 1552 | 3 | 4656 |
| 22 | | | 4 | 6208 |
| 23 | | | 5 | 7760 |
| 24 | $Co_{70}Fe_5Si_{10}B_{15}$ | 2004 | 3 | 6012 |
| 25 | $Co_{75.3}Fe_{4.7}Si_4B_{16}$ | 2453 | 2 | 4906 |
| 26 | | | 3 | 7359 |
| 27 | | | 4 | 9812 |
| 28 | | | 5 | 12265 |
| 29 | $Co_{65.7}Fe_{4.3}Si_{17}B_{13}$ | 2241 | 2 | 4482 |
| 30 | | | 3 | 6723 |
| 31 | | | 4 | 8964 |
| 32 | | | 5 | 11205 |
| 33 | $Co_{67}Fe_4Si_{19}B_{10}$ | 2098 | 2 | 4196 |
| 34 | | | 3 | 6294 |
| 35 | | | 4 | 8392 |
| 36 | | | 5 | 10490 |
| 37 | $Co_{61.8}Fe_{4.2}Ni_{4.2}Si_{10}B_{20}$ | 2350 | 4 | 9400 |
| 38 | $Co_{69.6}Fe_{4.6}Mo_{1.8}Si_8B_{16}$ | 2865 | 4 | 11460 |
| 39 | $Co_{70}Mn_6B_{24}$ | 2713 | 4 | 10852 |
| 40 | $Co_{81.5}Mo_9.Zr_{9.0}$ | 3075 | 4 | 12300 |

TABLE 2

| Sample No. | Operation maximum frequency (MHz) | TMR ratio | Dispersions of Hc value obtained when repeatedly measured (%) | Rectangle ratio | Vhalf (mV) |
|---|---|---|---|---|---|
| 1 | 230 | 36 | 5.2 | 0.72 | 540 |
| 2 | 300 | 35 | 4.7 | 0.83 | 570 |
| 3 | 450 | 33 | 3.2 | 0.91 | 510 |
| 4 | 590 | 51 | 2.9 | 0.93 | 650 |
| 5 | 610 | 55 | 1.8 | 0.94 | 680 |
| 6 | 620 | 56 | 1.2 | 0.97 | 680 |
| 7 | 630 | 57 | 1.4 | 0.97 | 710 |
| 8 | 550 | 52 | 1.8 | 0.95 | 690 |
| 9 | 540 | 46 | 1.7 | 0.95 | 640 |
| 10 | 630 | 47 | 1.5 | 0.93 | 640 |
| 11 | 650 | 49 | 1.6 | 0.96 | 660 |
| 12 | 660 | 46 | 1.5 | 0.96 | 630 |
| 13 | 620 | 44 | 1.5 | 0.93 | 640 |
| 14 | 550 | 48 | 2.1 | 0.89 | 650 |
| 15 | 590 | 30 | 2.3 | 0.9 | 460 |
| 16 | 560 | 47 | 2.4 | 0.88 | 600 |
| 17 | 550 | 50 | 2.1 | 0.93 | 650 |
| 18 | 600 | 31 | 1.8 | 0.91 | 470 |
| 19 | 650 | 53 | 1.9 | 0.92 | 660 |
| 20 | 570 | 54 | 1.9 | 0.92 | 670 |
| 21 | 580 | 50 | 1.4 | 0.96 | 640 |
| 22 | 590 | 51 | 1.8 | 0.9 | 640 |
| 23 | 630 | 53 | 2 | 0.93 | 670 |
| 24 | 540 | 56 | 2.2 | 0.93 | 720 |
| 25 | 530 | 56 | 2.1 | 0.92 | 710 |
| 26 | 550 | 53 | 2.4 | 0.88 | 690 |
| 27 | 570 | 48 | 2.1 | 0.93 | 630 |
| 28 | 490 | 45 | 2.5 | 0.89 | 620 |
| 29 | 570 | 50 | 1.8 | 0.93 | 650 |
| 30 | 590 | 51 | 1.9 | 0.91 | 650 |
| 31 | 510 | 48 | 1.8 | 0.9 | 630 |
| 32 | 590 | 45 | 2.1 | 0.93 | 620 |
| 33 | 550 | 51 | 2.6 | 0.89 | 660 |
| 34 | 560 | 49 | 2.3 | 0.91 | 640 |
| 35 | 570 | 46 | 1.7 | 0.92 | 620 |
| 36 | 500 | 45 | 1.8 | 0.93 | 600 |
| 37 | 520 | 48 | 1.9 | 0.94 | 630 |
| 38 | 510 | 43 | 2.4 | 0.91 | 570 |
| 39 | 470 | 42 | 2.6 | 0.93 | 560 |
| 40 | 390 | 41 | 3.1 | 0.87 | 530 |

FIGS. 7A, 7B, 7C, 7D show measured results of magnetic properties of the respective samples 1 to 40 wherein the horizontal axis represents the normalized resistance of the magnetization free layer and the vertical axis represents the TMR ratio, the operation maximum frequency, the dispersions of coercive force and the rectangle ratio, respectively. A study of FIGS. 7A to 7D reveals that, when the normalized of the magnetization free layer falls within a range of from 2000 $\Omega nm^2$ to 10000 $\Omega nm^2$, i.e., falls within the ranges shown by broken lines, the operation maximum frequency and the rectangle ratio can be improved considerably. Moreover, it is to be understood that the TMR ratio and the dispersions of the coercive force Hc also can be improved. Moreover, from the table 2, it is to be understood that, when the normalized resistance of the magnetization free layer falls within a range from 2000 $\Omega nm^2$ to 10000 $\Omega nm^2$ (the samples 4 to 14, the sample 16, the sample 17, the samples 19 to 27, the samples 29 to 31, the samples 33 to 35, the sample 37), Vhalf becomes a high value, 550 mV, the bias voltage dependence also being improved.

In this case, although other layers than the magnetization free layer have the arrangement of general TMR film, the normalized resistance of the magnetization free layer may become larger than that of the general TMR film (FeCo alloy and so on).

Figure 7A:
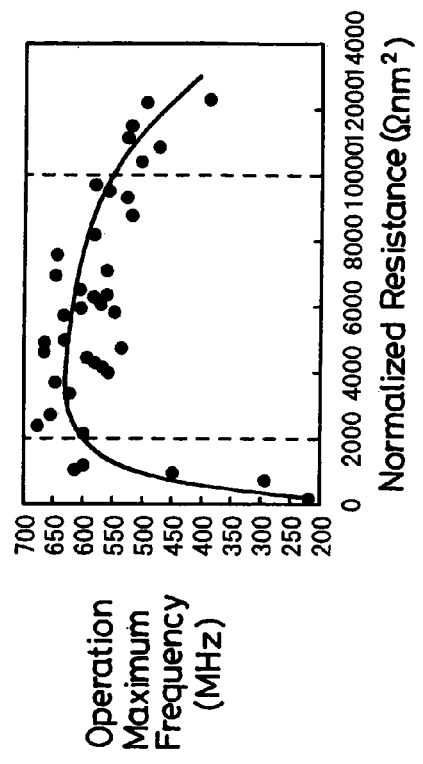
FIG. 7A is a diagram showing a relationship between a normalized resistance of a magnetization free layer and a TMR ratio.
Figure 7B:
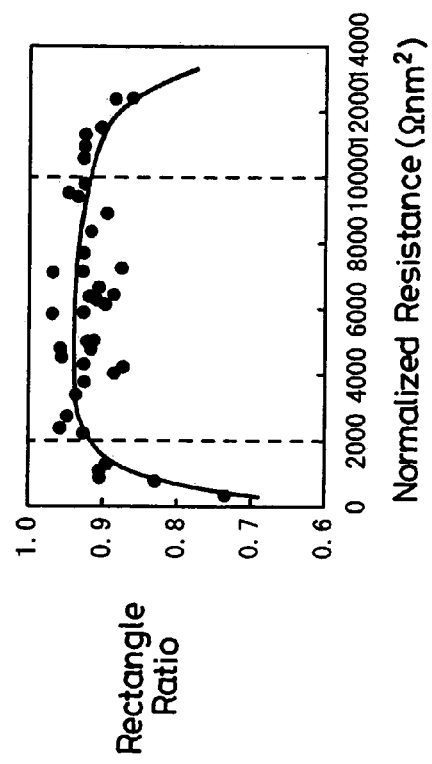
FIG. 7B is a diagram showing a relationship between a normalized resistance of a magnetization free layer and an operation maximum frequency.
Figure 7C:
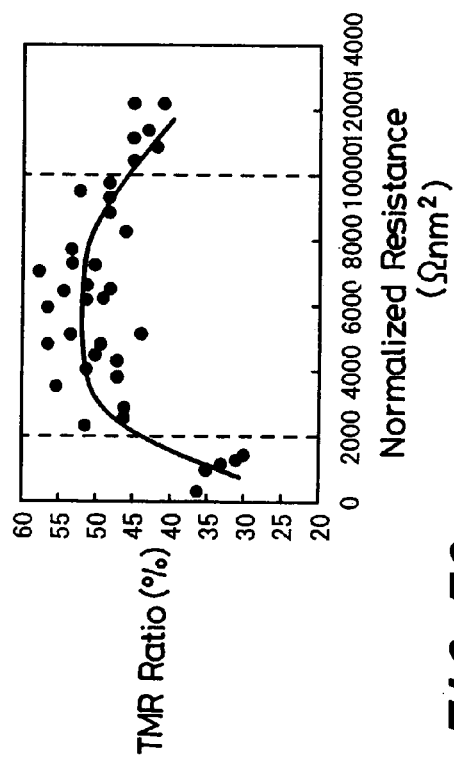
FIG. 7C is a diagram showing a relationship between a normalized resistance of a magnetization free layer and dispersions of a coercive force.
Figure 7D:
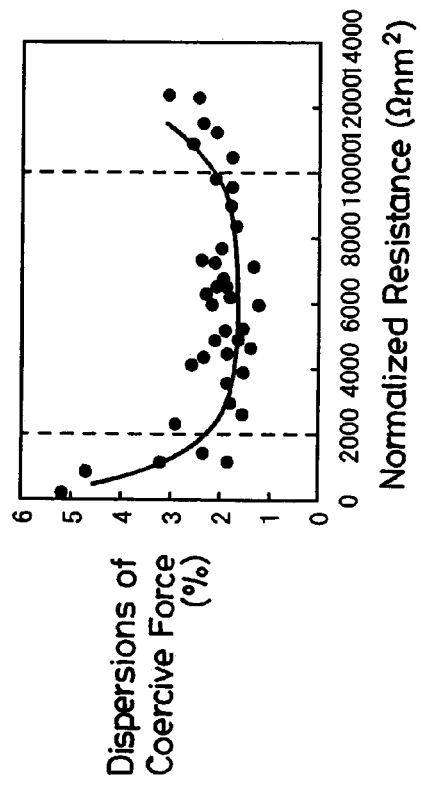
FIG. 7D is a diagram showing a relationship between a normalized resistance of a magnetization free layer and a rectangle ratio

To be concrete, when the normalized resistance of the magnetization free layer falls within the above-mentioned range, it is to be understood from FIG. 7C that the dispersions of the coercive force Hc can be controlled so as to become less than 4%. Hence, it is to be noted that the TMR element is very stable magnetically.

Further, from FIG. 7A, it is to be understood that the TMR ratio is higher than 45%. Furthermore, it is to be understood from the table 2 that the Vhalf value also is higher than 550 mV. As a consequence, a difference voltage between "1" and "0" obtained during the MRAM is operating may increase. On the other hand, in the conventional arrangement in which the magnetization free layer is made of an alloy such as CoFe and the like, it is to be understood from the table 1 that the normalized resistance becomes less than 2000 $\Omega nm^2$.

Having compared the arrangement, of the present invention with the above conventional arrangement, since the normalized resistance of the magnetization free layer falls within the wide range of from 2000 $\Omega nm^2$ to 10000 $\Omega nm^2$, the operation maximum frequency and the rectangle ratio can be improved considerably, and the TMR ratio and the dispersions of the coercive force Hc also can be improved.

Accordingly, it is to be understood that, if the normalized resistance of the magnetization free layer of the TMR element falls within the above-mentioned range of from 2000 $\Omega nm^2$ to 10000 $\Omega nm^2$, then when the TMR element is applied to the magnetic memory device, the asteroid property can be improved. Furthermore, it is also to be understood that the difference voltage between "1" and "0" obtained during the magnetic memory device is being operated can increase to fabricate the MRAM having very small write and read errors.

The magnetoresistive effect element (TMR element and so forth) of the present invention is not limited to the aforementioned magnetic memory device and can be applied to a magnetic head, a hard disk drive and a magnetic sensor having this magnetic head mounted thereon, integrated circuit chips. Further, this magnetoresistive effect element can be applied to various kinds of electronic equipment such as personal computers, personal digital assistants and mobile phones, electronic devices and so on.

The present invention is not limited to the above-mentioned embodiment and can take various arrangements without departing from the gist of the present invention.

According to the above-mentioned magnetoresistive effect element of the present invention, by regulating the range in which the normalized resistance of the magnetization free layer falls, it becomes possible to improve the frequency characteristic relative to the external magnetic field, to increase the magnetoresistive changing ratio (magnetoresistive ratio) and to improve the rectangle ratio of the resistance-external magnetic field curve.

Moreover, it is possible to improve the bias voltage dependence of the magnetoresistive changing ratio (magnetoresistive ratio) and the dispersions of the coercive force.

Therefore, it is possible to fabricate the magnetoresistive effect element that can stably retain satisfactory magnetic properties.

According to the magnetic memory device of the present invention, when information is to be read out from the magnetic memory device, the bias voltage dependence property of the magnetoresistive changing ratio (magnetoresistive ratio) can be improved and the low-resistance state and the high-resistance state can easily be discriminated from each other, thereby making it possible to improve the read characteristic.

Moreover, when information is to be written in the magnetic memory device, the noise in the resistance-external magnetic field curve can be decreased so that the asteroid property can be improved. Consequently, the write error can be decreased, and hence the write characteristic can be improved.

Therefore, it is possible to fabricate the magnetic memory device having very small write error and read error, excellent write characteristic and read characteristic and which can operate stably.

The invention claimed is:

1. A magnetic memory device comprising:
   a magnetoresistive effect element designed such that said magnetoresistive effect element includes a ferromagnetic tunnel junction formed between a pair of ferromagnetic layers across a tunnel barrier layer to cause a current to flow in the direction perpendicular to the film plan; and
   word lines and bit lines sandwiching said magnetoresistive effect element in the thickness direction,
   wherein,
   said magnetic memory device is characterized in that one of said ferromagnetic layers in a magnetization fixed layer and the other ferromagnetic layer is a magnetization free layer,
   said magnetization free layer has a normalized resistance ranging from 2000 $\Omega nm^2$ to 10000 $\Omega nm^2$ where a product of a specific resistance obtained when a current flows to the film thickness direction and a film thickness is defined as said normalized resistance,
   and
   said magnetization fixed layer comprises two layers of fixed magnetization with a nonmagnetic conductive layer there between.

2. A magnetic memory device according to claim 1, wherein said magnetoresistive effect element is a tunnel magnetoresistive effect element using a tunnel barrier made of an insulating material or a semiconductor material as said intermediate layer.

3. A magnetic memory device according to claim 1, wherein said magnetoresistive effect element includes a lamination layer ferri structure.

* * * * *